(12) United States Patent
Burton et al.

(10) Patent No.: US 12,267,103 B2
(45) Date of Patent: Apr. 1, 2025

(54) ELECTROMAGNETIC FIELD RECEIVER

(71) Applicant: BRITISH TELECOMMUNICATIONS PUBLIC LIMITED COMPANY, London (GB)

(72) Inventors: Fraser Burton, London (GB); Liam Bussey, London (GB)

(73) Assignee: British Telecommunications Public Limited Company (GB)

( * ) Notice: Subject to any disclaimer, the term of this patent is extended or adjusted under 35 U.S.C. 154(b) by 86 days.

(21) Appl. No.: 18/005,318

(22) PCT Filed: Jun. 10, 2021

(86) PCT No.: PCT/EP2021/065655
§ 371 (c)(1),
(2) Date: Jan. 12, 2023

(87) PCT Pub. No.: WO2022/017679
PCT Pub. Date: Jan. 27, 2022

(65) Prior Publication Data
US 2023/0261743 A1    Aug. 17, 2023

(30) Foreign Application Priority Data

Jul. 16, 2020 (GB) .................... 2010995

(51) Int. Cl.
*H04B 10/073* (2013.01)
*G01R 29/08* (2006.01)
*H04B 1/16* (2006.01)

(52) U.S. Cl.
CPC ....... *H04B 10/073* (2013.01); *G01R 29/0885* (2013.01); *H04B 1/16* (2013.01); *H04B 2210/006* (2013.01)

(58) Field of Classification Search
CPC .. H04B 10/073; H04B 1/16; H04B 2210/006; H04B 1/40; H04B 10/00; G01R 29/0885
(Continued)

(56) References Cited

U.S. PATENT DOCUMENTS 6,115,122 A      9/2000  Bao et al.
6,826,339 B1 *  11/2004  Mueller ................. G02F 1/365
                                                                  65/393
(Continued)

FOREIGN PATENT DOCUMENTS

CN        1882859 A      12/2006
CN     205691490 U      11/2016
(Continued)

OTHER PUBLICATIONS

Christopher L. Holloway et al., "Detecting and Receiving Phase Modulated Signals with a Rydberg Atom-Based Mixer". Mar. 27, 2019 (Year: 2019).*

(Continued)

*Primary Examiner* — Abbas H Alagheband
(74) *Attorney, Agent, or Firm* — EIP US LLP

(57) ABSTRACT

This invention relates to an electromagnetic field receiver controller including a first and second optical transmitter, a transmission medium and an optical receiver. The first optical transmitter is configured to transmit a probe signal to the optical receiver via the transmission medium at a probe frequency and the second transmitter is configured to transmit a coupling signal via the transmission medium at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect in the electromagnetic (Continued)

field receiver such that an incident electromagnetic field at the transmission medium causes a detectable change in power of the probe signal at the optical receiver.

13 Claims, 8 Drawing Sheets

(58) Field of Classification Search
USPC .......................................................... 398/25
See application file for complete search history.

(56) References Cited

U.S. PATENT DOCUMENTS

| | | | |
|---|---|---|---|
| 10,547,460 | B2 | 1/2020 | Wang et al. |
| 10,684,591 | B1 * | 6/2020 | Burke ................... H01S 3/1303 |
| 10,705,799 | B2 | 7/2020 | Scarlett |
| 10,763,966 | B1 * | 9/2020 | Deb ................. H04B 10/25759 |
| 10,979,147 | B2 * | 4/2021 | Gordon ................ H04B 10/503 |
| 11,402,479 | B1 | 8/2022 | Pecen et al. |
| 11,835,564 | B2 * | 12/2023 | Burton ............... G02B 6/02328 |
| 2003/0052264 | A1 * | 3/2003 | Baba ........................ H01J 49/42 250/281 |
| 2004/0264903 | A1 | 12/2004 | Dridi et al. |
| 2008/0237506 | A1 | 10/2008 | Ophey et al. |
| 2008/0278710 | A1 * | 11/2008 | Schmidt .................. G04F 5/145 356/73 |
| 2009/0217045 | A1 | 8/2009 | Skoric et al. |
| 2009/0289629 | A1 * | 11/2009 | Tuchman ................ G01R 33/26 324/309 |
| 2011/0095755 | A1 | 4/2011 | Maki |
| 2016/0033422 | A1 | 2/2016 | Vaisman et al. |
| 2016/0363617 | A1 * | 12/2016 | Anderson .......... G01R 29/0885 |
| 2019/0156066 | A1 | 5/2019 | Foster et al. |
| 2019/0187198 | A1 * | 6/2019 | Anderson .......... G01R 29/0878 |
| 2019/0293736 | A1 * | 9/2019 | Bulatowicz ............ G01C 19/62 |
| 2020/0142128 | A1 | 5/2020 | Baer et al. |
| 2020/0186350 | A1 | 6/2020 | Wentz et al. |
| 2020/0295838 | A1 | 9/2020 | Gordon et al. |
| 2021/0048465 | A1 | 2/2021 | Anderson et al. |
| 2021/0250101 | A1 | 8/2021 | Gordon et al. |
| 2022/0069990 | A1 | 3/2022 | Ryckman et al. |
| 2022/0196716 | A1 | 6/2022 | Anderson et al. |

FOREIGN PATENT DOCUMENTS

| | | | | |
|---|---|---|---|---|
| CN | 104714110 | B | | 9/2017 |
| CN | 107179450 | A | | 9/2017 |
| CN | 107462849 | A | | 12/2017 |
| CN | 108152602 | A | | 6/2018 |
| CN | 106124856 | B | | 10/2018 |
| CN | 108809341 | A | * | 11/2018 ............... H04B 1/16 |
| CN | 108927314 | A | | 12/2018 |
| CN | 109040067 | A | | 12/2018 |
| CN | 109142891 | A | | 1/2019 |
| CN | 109342830 | A | | 2/2019 |
| CN | 109905177 | A | | 6/2019 |
| CN | 107179450 | B | | 10/2019 |
| CN | 107462849 | B | | 1/2020 |
| CN | 113504415 | A | | 10/2021 |
| CN | 113514698 | A | | 10/2021 |
| EP | 2230794 | A2 | | 9/2010 |
| EP | 3308146 | A1 | | 4/2018 |
| EP | 3308146 | B1 | * | 2/2020 ......... G01R 29/0885 |
| EP | 3658970 | A2 | | 6/2020 |
| GB | 2588754 | A | | 5/2021 |
| GB | 2597260 | A | | 1/2022 |
| GB | 2599400 | A | | 4/2022 |
| GB | 2605123 | A | | 9/2022 |
| GB | 2606167 | A | | 11/2022 |
| WO | 2011160977 | A1 | | 12/2011 |
| WO | 2017177105 | A1 | | 10/2017 |
| WO | WO-2018103897 | A1 | | 6/2018 |
| WO | 2020097058 | A1 | | 5/2020 |
| WO | 2021078438 | A1 | | 4/2021 |
| WO | 2021148242 | | | 7/2021 |
| WO | WO-2021243260 | A1 | | 12/2021 |
| WO | 2022096403 | A1 | | 5/2022 |

OTHER PUBLICATIONS

Anderson D.A., et al., "An Atomic Receiver for AM and FM Radio Communication", Aug. 26, 2018, 6 pages.
Combined Search and Examination Report under sections 17 & 18(3) for Great Britain Application No. 2010995.5, mailed on Apr. 9, 2021, 12 pages.
Combined Search and Examination Report under Sections 17 and 18(3) for Great Britain Application No. 1915420.2, mailed on Apr. 22, 2020, 6 pages.
Epple G., et al., "Rydberg Atoms in Hollow-Core Photonic Crystal Fibres", Nature Communications, Jun. 19, 2014, 5 pages.
Examination Report for European Application No. 20765052.4 , mailed on Aug. 16, 2022, 4 pages.
Extended European Search Report for Application No. 19205106.8, mailed on Apr. 29, 2020, 6 pages.
Holloway C.L., et al., "A Multiple-Band Rydberg-Atom Based Receiver/Antenna: AM/FM Stereo Reception", National Institute of Standards and Technology (NIST), Boulder, CO 80305, Mar. 2, 2019, 10 pages.
Holloway C.L., et al., "Detecting and Receiving Phase Modulated Signals with a Rydberg Atom-Based Mixer", National Institute of Standards and Technology, Boulder, CO 80305, USA, Mar. 27, 2019, 5 pages.
Holloway C.L., et al., "Development and Applications of a Fiber-Coupled Atom-Based Electric Field Probe", 2018 International Symposium on Electromagnetic Compatibility (EMC EUROPE), IEEE, Aug. 27-30, 2018, pp. 381-385.
International Preliminary Report on Patentability for Application No. PCT/EP2021/065655, mailed on Jul. 29, 2022, 15 pages.
International Preliminary Report on Patentability for Application No. PCT/EP2020/075070, mailed on May 5, 2022, 8 pages.
International Search Report and Written Opinion for Application No. PCT/EP2020/075070, mailed on Dec. 15, 2020, 12 pages.
International Search Report and Written Opinion for Application No. PCT/EP2021/065655, mailed on Aug. 23, 2021, 15 pages.
International Search Report and Written Opinion for Application No. PCT/EP2022/0053845, mailed on May 16, 2022, 16 pages.
Kaatuzian H., et al., "Electromagnetically Induced Transparency Using Six Level Atoms Doped in the Crystalline Medium," Nov. 21, 2005, 4 pages.
Kumar S., et al., "Atom-Based Sensing of Weak Radio Frequency Electric Fields Using Homodyne Readout," Scientific Reports, Feb. 20, 2017, vol. 7 (42981), retrieved from the internet URL:https://www.nature.com/articles/srep42981.pdf, 10 pages.
Ma L., et al., "Paschen-Back Effect and Rydberg-State Diamagnetism In Vapor-Cell Electromagnetically Induced Transparency," arxiv.org, Atomic Physics, Feb. 22, 2017, 6 pages.
Meyer D.H., et al., "Assessment of Rydberg Atoms for Wideband Electric Field Sensing," arxiv.org, Journal of Physics B: Atomic, Molecular and Optical Physics, Jan. 13, 2020, 16 pages.
Office action for Chinese Application No. 202080066526.3, mailed on Jul. 7, 2022, 10 pages.
Search Report under Section 17 for Great Britain Application No. 2202067.1, mailed on Jul. 13, 2022, 4 pages.
Simons M.T., et al., "A Rydberg Atom-Based Mixer: Measuring the Phase of a Radio Frequency Wave", Mar. 9, 2019, 4 pages.
Simons M.T., et al., "Fiber-Coupled Vapor Cell for a Portable Rydberg Atom-Based Radio Frequency Electric Field Sensor", Applied Optics, Jul. 26, 2018, vol. 57 (22), 5 pages.
Song Z., et al., "Rydberg-Atom-Based Digital Communication using a Continuously Tunable Radio-Frequency Carrier", Mar. 18, 2019, vol. 27 (6), 10 pages.
"Combined Search and Examination Report under Sections 17 and 18(3) for Great Britain Application No. 2017392.8, mailed on Aug. 12, 2021", 13 pages.

(56) References Cited

OTHER PUBLICATIONS

"Combined Search and Examination Report under Sections 17 and 18(3) for Great Britain Application No. 2206965.2, mailed on Dec. 22, 2022", 10 pages.
"Examination Report and Intention to Grant received for Great Britain Patent Application No. 2202067.1, mailed on Nov. 21, 2023", 2 pages.
"Extended European Search Report for Application No. 22206146.7, mailed on Apr. 18, 2023", 7 pages.
"Extended European Search Report received for European Patent Application No. 22189677.2, mailed on Feb. 7, 2023", 9 pages.
"Intention to Grant received for European Patent Application No. 21802668.0, mailed on Jul. 11, 2024", 8 pages.
"International Preliminary Report on Patentability for Application No. PCT/EP2021/080185, mailed on May 19, 2023", 9 pages.
"International Search Report and Written Opinion for International Application No. PCT/EP2021/080185, mailed On Feb. 10, 2022", 16 pages.
"International Search Report and Written Opinion received for PCT Patent Application No. PCT/EP2023/059240, mailed on Oct. 27, 2023", 16 pages.
"Inverse Design of Photonics", Nanoscale and Quantum Photonics Lab, 3 pages.
"Invitation to Pay Additional Fees with Partial International Search for Application No. PCT/EP2023/059240, mailed on Jun. 30, 2023", 12 pages.
"Office Action received for European Patent Application No. 21802668.0, mailed on Feb. 22, 2024", 6 pages.
"Office Action received for Great Britain Patent Application No. 2211667.7, mailed on Jan. 24, 2023", 6 pages.
"Partial European Search Report for European Patent Application No. 22184801.3, mailed on Jan. 4, 2023", 11 pages.
"Search Report under Section 17 for Great Britain Application No. 2216601.1, mailed on May 2, 2023", 4 pages.
Brodnik, et al., "Widely Tunable Optical Local Oscillator Scheme for RF Photonic Down-Conversion", IEEE Avionics and Vehicle Fiber-Optics and Photonics Conference (AVFOP), Nov. 2019, 2 pages.
Disco, "Basic Processes Using Blade Dicing Saws", 2020, 5 pages.
Engelmann, et al., "Lithography Materials", IBM Research, 2022, 3 pages.
Grubel, "Silicon Photonic Physical Unclonable Function", Optics Express, vol. 25, No. 11,, May 29, 2017, pp. 12710-12721.
Ho, et al., "Focused Ion Beam Etching for the Fabrication of Micropillar Microcavities Made of III-V Semiconductor Materials", Journal of Vacuum Science & Technology B, vol. 25, No. 4, Jul./Aug. 2007, pp. 1197-1202.
Hong, et al., "Nano-optical systems in CMOS", International Midwest Symposium on Circuits and Systems (MWSCAS), 2017, pp. 906-909.
Hu, et al., "Flexible Integrated Photonics: Where Materials, Mechanics and Optics Meet [Invited]", Optical Materials Express, vol. 3, No. 9, Aug. 12, 2013, 19 pages.
Jiang, et al., "Fabrication and Application of Arrays related to Two-Dimensional Materials", Rare Metals, vol. 41, No. 1, 2022, pp. 262-286.
Kashaganova, et al., "Application of Apodized Fiber Bragg Gratings in Information Security Systems", Proceedings of 14SDG Workshop 2021, Oct. 2021, pp. 451-460.
Lin, et al., "High Performance Polarization Management Devices Based on Thin-Film Lithium Niobate", Light: Science & Applications, vol. 11, No. 93, Apr. 13, 2022, 25 pages.
Lu, et al., "CMOS Optical PUFs Using Noise-Immune Process-Sensitive Photonic Crystals Incorporating Passive Variations for Robustness", IEEE Journal of Solid-State Circuits, vol. 53, No. 9, Sep. 2018, pp. 2709-2721.
Madhu, "Difference Between Edge and Screw Dislocations", Compare the Difference Between Similar Terms, Jun. 14, 2018, 6 pages.
Matkovskii, et al., "Transient and Stable Color Centers in Pure and Cu-doped LiNbO3", Crystal Research and Technology, vol. 38, No. 3-5, 2003, pp. 388-393.
McGrath, et al., "A PUF Taxonomy", Applied Physics Reviews, vol. 6, No. 1, Feb. 12, 2019, pp. 1-25.
Mesaritakis, et al., "Physical Unclonable Function based on a Multi-Mode Optical Waveguide", Scientific Reports, vol. 8, No. 9653, Jun. 25, 2018, 12 pages.
Molesky, et al., "Inverse Design in Nanophotonics", Nature Photonics, vol. 12, Nov. 2018, pp. 659-670.
Packaging, "Methods of Dicing", Optical Materials Processed, [Retrieved on Jul. 5, 2023], 3 pages.
Pavanello, et al., "Recent Advances in Photonic Physical Unclonable Functions", IEEE European Test Symposium (ETS), May 2021, 11 pages.
Reiche, et al., "On the Electronic Properties of a Single Dislocation", Journal of Applied Physics, vol. 115, No. 194303, May 19, 2014, 7 pages.
Safescan, "How Do Central Banks Protect Banknotes from Counterfeiting, How Does Ultraviolet Detection Work?", Counterfeit Detection, Retrieved on [Nov. 7, 2022], 1 page.
Sato, et al., "Clonable PUF: On the Design of PUFs that Share Equivalent Responses", IEEE International Symposium on Circuits and Systems (ISCAS), Retrieved from the Internet: URL: https://eprint.iacr.org/2021/341.pdf, 2021, 5 pages.
Selvaraja, "Fabrication of Photonic Wire and Crystal Circuits in Silicon-on-Insulator Using 193-nm Optical Lithography", Journal of Lightwave Technology, vol. 27, No. 18, Sep. 15, 2009, pp. 4076-4083.
Skoric, et al., "Authenticated Communication from Quantum Readout of PUFs", Quantum Information Processing, vol. 16, No. 8, Article No. 200, Jul. 2017, 9 pages.
Smart Fibres, "Fibre Bragg Grating Technology", 2022, 7 pages.
Talukder, et al., "Electrolithography—A New and Versatile Process for Nano Patterning", Scientific Reports, vol. 5, 2015, pp. 1-11.
Tarik, et al., "Robust Optical Physical Unclonable Function Using Disordered Photonic Integrated Circuits", De Gruyter, Nanophotonics, vol. 9, No. 9, Retrieved from the Internet: URL: https://www.degruyter.com/document/doi/10.1515/nanoph-2020-0049/html?lang=en, Jul. 3, 2020, pp. 2817-2828.
Wu, et al., "Unclonable Photonic Crystal Hydrogels with Controllable Encoding Capacity for Anticounterfeiting", ACS Applied Materials and Interfaces, vol. 14, Jan. 2022, pp. 2369-2380.
Yin, et al., "Catch and release of microwave photon states", Physical review letters, vol. 110, No. 10, 2013, 1107001-1-1107001-5.
Yu, et al., "Secure and Robust Error Correction for Physical Unclonable Functions", IEEE Design & Test of Computers, vol. 27, No. 1, 2010, pp. 48-65.
International Preliminary Report on Patentability received for PCT Patent Application No. PCT/EP2023/059240, mailed on Nov. 21, 2024, 10 pgs.
International Preliminary Report on Patentability received for PCT Patent Application No. PCT/EP2023/062849, mailed on Aug. 23, 2024, 19 pgs.
International Search Report and Written Opinion received for PCT Patent Application No. PCT/EP2023/062849, mailed on Jul. 31, 2023, 12 pgs.
Written Opinion of the International Preliminary Examining Authority received for PCT Patent Application No. PCT/EP2023/062849, mailed on Jul. 25, 2024, 7 pgs.
Written Opinion of the International Preliminary Examining Authority received for PCT Patent Application No. PCT/EP2023/062849, mailed on Oct. 20, 2023, 6 pgs.
Chen, et al., "FiberID: Molecular-level Secret for Identification of Things," IEEE International Workshop on Information Forensics and Security, 2014, pp. 84-88.
Gangopadhyay, et al., "Prospects for Fibre Bragg Gratings and Fabry-Perot Interferometers in fibre-optic vibration sensing," Sensors and Actuators A, vol. 113, No. 1, 2004, pp. 20-38.
Goki, et al., "Optical identification using physical unclonable functions," Retrieved from: arXiv:2305.02141, May 2023, 10 pgs.,.

(56) References Cited

OTHER PUBLICATIONS

Goki, et al., "Optical Network Authentication through Rayleigh Backscattering Fingerprints of the Composing Fibers," IEEE Global Communications Conference: Optical Network and Systems, Dec. 4, 2022, pp. 2146-2150.

Mesaritakis, et al., "Photonic Pseudo-Random No. Generator for Internet-of-Things Authentication using a Waveguide based Physical Unclonable Function," Retrieved from: arXiv:2001.11794, Jan. 31, 2020, 14 pgs.

* cited by examiner

Fig. 2
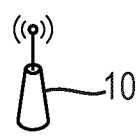
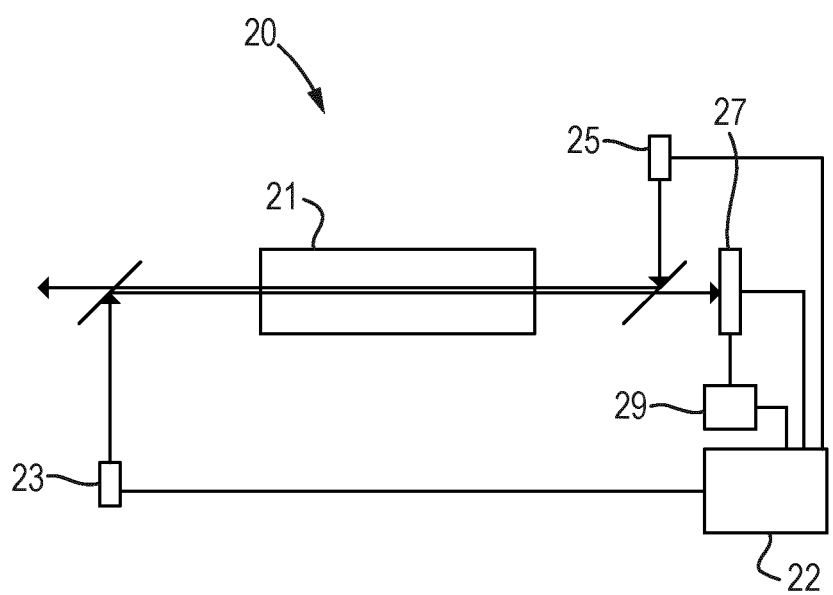

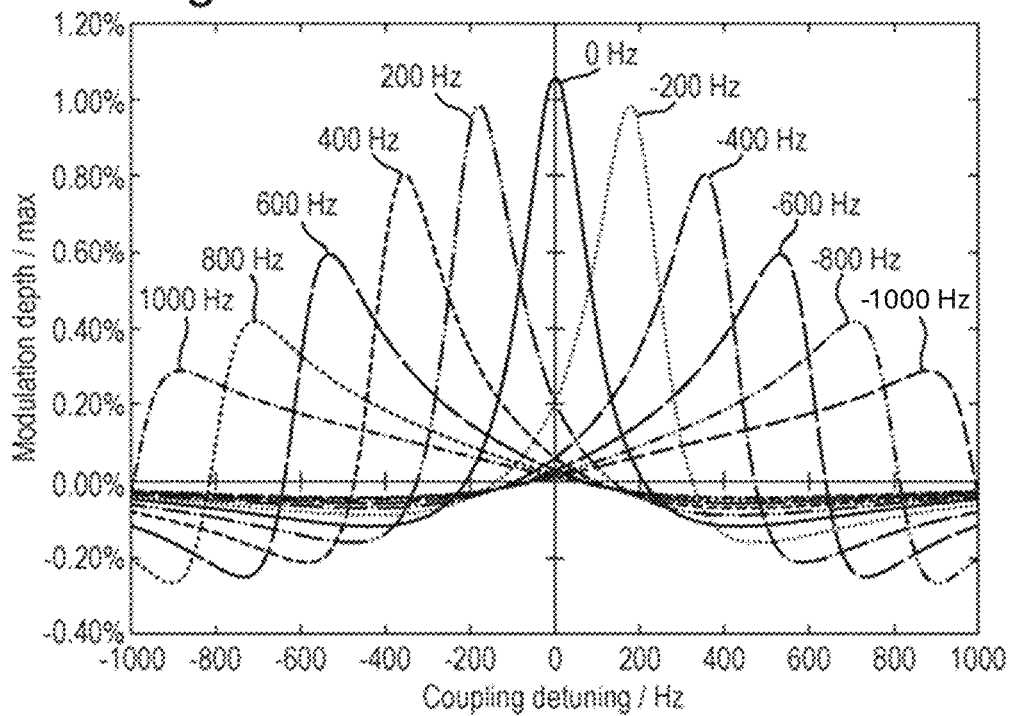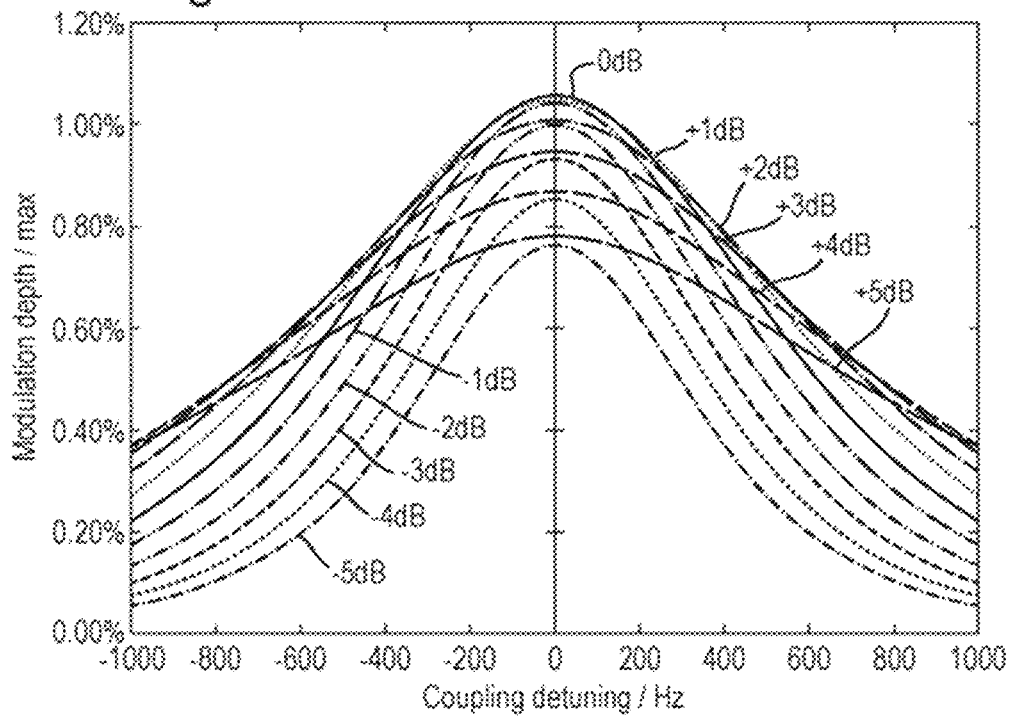

ELECTROMAGNETIC FIELD RECEIVER

PRIORITY CLAIM

The present application is a National Phase entry of PCT Application No. PCT/EP2021/065655, filed Jun. 10, 2021, which claims priority from GB Patent Application No. 2010995.5, filed Jul. 16, 2020, each of which is hereby fully incorporated herein by reference.

TECHNICAL FIELD

The present disclosure relates to an electromagnetic field receiver. In particular, this disclosure relates to a Radio Frequency (RF) receiver.

BACKGROUND

Conventional RF receivers, such as a dipole antenna, utilize metallic conductors in which electrons move along the conductor in response to an incident RF electric field to produce a small current. This current may then be processed (e.g. utilizing electronic circuits, mixers, amplifiers and digitizers) to convert this small current into a demodulated, amplified signal.

In many applications it is desirable to reduce the size of the RF receiver. However, conventional RF receivers based on metallic conductors are limited in size as the relationship between sensitivity, frequency and conductor length means that the RF receiver will not perform adequately below a certain size for a given application. An electrically small antenna is one that is operated at a frequency below its natural resonance, but these are limited by the Chu limit that will set the minimum size for any antenna used at a given frequency. A further limitation for conventional RF receivers is that the ability to sense weak RF signals is dependent on the receiver's gain, which is determined by the design of the antenna. Accordingly, the performance of a conventional antenna is restricted in size, bandwidth and sensitivity.

A new form of RF receiver is based on a Rydberg atom. A Rydberg atom is an atom with one or more electrons excited to a very high principal quantum number. These Rydberg atoms have several useful properties, such as very large dipole moments and long decay periods. These properties can be exploited to create an RF receiver that may receive and demodulate Amplitude-Modulated (AM), Frequency-Modulated (FM) and Phase Modulated (PM) RF electric fields over very large frequency ranges (e.g. from hundreds of MHz to 1 THz).

An example Rydberg-atom based RF receiver is shown in FIG. 1 and operates as follows. An atomic medium is provided which, in this example, is a glass cell filled with a low density vapor of alkali atoms (such as Rubidium-85). Each Rubidium-85 atom has a number of electron states, including the ground state ($|1\rangle$) and a plurality of excited states. The outer electron of the Rubidium-85 atom may be excited (e.g. by absorbing a photon of a particular wavelength) from the ground state ($|1\rangle$) to an excited state. The electron may then decay from the excited state to a lower excited state (that is, an excited state at a lower energy level) or to the ground state ($|1\rangle$). However, some of these transitions are not allowed as they are dipole forbidden.

In the RF receiver, a first laser (known as a "probe" laser) is passed through the atomic medium at a first wavelength which corresponds to the energy required to elevate the Rubidium-85 atom's outer electron from its ground state ($|1\rangle$) to a first excited state ($|2\rangle$). A second laser (known as a "coupling" laser) is also passed through the atomic medium in an opposing direction at a relatively large power level (compared to the probe laser) and at a second wavelength which corresponds to the energy required to elevate the Rubidium-85 atom's outer electron from the first excited state ($|2\rangle$) to a Rydberg state ($|3\rangle$). The transition from the Rydberg state ($|3\rangle$) to the ground state ($|1\rangle$) is forbidden so that the ground state ($|1\rangle$) becomes depopulated and so fewer atoms can absorb the probe laser operating at the first wavelength. Accordingly, the atomic medium becomes more transparent to the probe laser such that there is an increase in transmission of the probe laser, which is observable at an optical detector. This phenomenon is known as Electromagnetically Induced Transparency (EIT) and the received signal is known as the EIT signal. Specifically, the above description is of a ladder scheme EIT effect, but the skilled person would understand that the EIT effect may be realized through alternative electron transitions, such as the Vee and Lambda schemes.

Once the atomic medium has become transparent to the probe laser, then a further physical effect can be exploited to detect RF electric fields. As the Rubidium-85 atom's outer electron is much further away from the atomic nucleus when in the Rydberg state compared to the ground state, a large dipole moment is created and it becomes responsive to incident RF electric fields. An incident RF electric field may cause a further transition of an electron from the Rydberg state to an adjacent Rydberg state. If the transition from the adjacent Rydberg state to the ground state is not forbidden, then electrons may subsequently drop to the ground state so that the atomic medium becomes less transparent to the probe laser, causing a drop in amplitude of the EIT signal. This drop in amplitude of the EIT signal is directly proportional to the incident RF electric field's amplitude, thus creating a Rydberg-atom based AM RF receiver. A more detailed explanation of this effect can be found in the article, "A Multiple-Band Rydberg-Atom Based Receiver/Antenna: AM/FM Stereo Reception", Holloway et al., National Institute of Standards and Technology).

Furthermore, a Rydberg-atom based FM RF receiver works in a similar manner. That is, when the RF electric field changes (or "detunes") from its resonant RF transition frequency, the EIT signal splits into two non-symmetrical peaks. The separation of the two peaks increases with RF detuning. By locking the probe laser and coupling laser to particular frequencies, then the optical detector output is directly correlated to the FM RF electric field.

Rydberg RF receivers may also be used to detect phase modulated RF fields, such as those of Binary Phase-Shift Keying (BPSK), Quadrature Phase-Shift Keying (QPSK), and Quadrature Amplitude Modulation (QAM) signals (used in many wireless and cellular communications protocols). In these modulation schemes, data is transmitted by modulating the phase of a carrier. To detect the carrier's phase, a reference RF field being on-resonance with the transition to the Rydberg state is applied to the atomic medium, which acts as a local oscillator. The difference frequency, or "intermediate frequency", is detected and the phase of the intermediate frequency signal corresponds directly to the relative phase between the local oscillator and the incident RF electric field.

Regardless of the modulation scheme used (amplitude, frequency or phase), the Rydberg atom based RF detector may be configured to detect RF fields of a specific frequency by selecting a particular second wavelength of the coupling laser so that the electrons of the atomic medium are elevated to a particular Rydberg state. This Rydberg state is selected so that photons at the specific frequency to be detected will elevate electrons from this Rydberg state to its adjacent Rydberg state, thus creating a detectable change in the EIT signal that may be observed at the optical detector. The magnitude of the EIT signal, known as the "modulation depth", is the difference between the depth of the drop in amplitude of the EIT signal when there is an incident RF electric field and when there is no incident RF electric field. The EIT signal is at its optimal depth (i.e. thereby giving an optimal Signal to Noise Ratio (SNR)) when the frequency of the RF field matches (i.e. is "resonant" with) the energy required for the transition from this particular Rydberg state to its adjacent Rydberg state. It is desirable to maximize this depth so as to enable higher speed and/or lower error rate communications. However, as the RF field being detected may drift away from this resonant frequency (e.g. due to Doppler shift or antenna drift), the EIT signal's depth may be sub-optimal. It is desirable to alleviate this problem.

SUMMARY

According to a first aspect of the disclosure, there is provided a method of controlling an electromagnetic field receiver, the electromagnetic field receiver comprising a first and second optical transmitter, a transmission medium and an optical receiver, wherein the first optical transmitter is configured to transmit a probe signal to the optical receiver via the transmission medium at a probe frequency and the second transmitter is configured to transmit a coupling signal via the transmission medium at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect in the electromagnetic field receiver such that an incident electromagnetic field at the transmission medium causes a detectable change in power of the probe signal at the optical receiver, the method comprising varying one or both of an intensity value and the coupling frequency of the coupling signal so as to cause a variation in the change in power of the probe signal at the optical receiver; monitoring the variation in the change in power of the probe signal; and based on the monitoring, setting the intensity value and/or coupling frequency of the coupling signal so as to increase the change in power of the probe signal.

The variation in the coupling frequency may cause a greater variation in the change in power of the probe signal at the optical receiver than a variation in the intensity value, and the method may further comprise varying the coupling frequency of the coupling signal so as to cause the variation in the change in power of the probe signal at the optical receiver; monitoring the variation in the change in power of the probe signal in response to the variation of the coupling frequency; based on the monitoring in response to the variation of the coupling frequency, setting the coupling frequency of the coupling signal so as to increase the change in power of the probe signal; and then, varying the intensity value of the coupling signal so as to cause the variation in the change in power of the probe signal at the optical receiver; monitoring the variation in the change in power of the probe signal in response to the variation of the intensity value; based on the monitoring in response to the variation of the intensity value, setting the intensity value of the coupling signal so as to increase the change in power of the probe signal.

The variation in the intensity value may cause a greater variation in the change in power of the probe signal at the optical receiver than a variation in the coupling frequency, and the method may further comprise varying the intensity value of the coupling signal so as to cause the variation in the change in power of the probe signal at the optical receiver; monitoring the variation in the change in power of the probe signal in response to the variation of the intensity value; based on the monitoring in response to the variation of the intensity value, setting the intensity value of the coupling signal so as to increase the change in power of the probe signal; and then, varying the coupling frequency of the coupling signal so as to cause the variation in the change in power of the probe signal at the optical receiver; monitoring the variation in the change in power of the probe signal in response to the variation of the coupling frequency; based on the monitoring in response to the variation of the coupling frequency, setting the coupling frequency of the coupling signal so as to increase the change in power of the probe signal.

Varying the intensity value and/or coupling frequency of the coupling signal, monitoring the variation in the change in power of the probe signal, and setting the coupling frequency based on the monitoring may be performed iteratively until a termination condition is met. The termination condition may be that the power of the probe signal following the change is less than or equal to the power of the probe signal before the change.

The transmission medium may include a metal vapor, which may be an alkali metal, which may be one of: Rubidium, Cesium or Strontium.

The electromagnetic field may be a Radio Frequency (RF) field and the electromagnetic field detector may be an RF detector.

According to a second aspect of the disclosure, there is provided a computer program product comprising instructions which, when the program is executed by a computer, cause the computer to carry out the method of the first aspect of the disclosure. The computer program may be stored on a computer-readable data carrier.

According to a third aspect of the disclosure, there is provided an electromagnetic field receiver controller, the electromagnetic field receiver comprising a first optical transmitter, a second optical transmitter, a transmission medium, and an optical receiver, wherein the first optical transmitter is configured to transmit a probe signal to the optical receiver via the transmission medium at a probe frequency and the second transmitter is configured to transmit a coupling signal via the transmission medium at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect in the electromagnetic field receiver such that an incident electromagnetic field at the transmission medium causes a detectable change in power of the probe signal at the optical receiver, wherein the controller is configured to implement the method of the first aspect of the disclosure.

According to a fourth aspect of the disclosure, there is provided a system comprising an electromagnetic field receiver and the electromagnetic field receiver controller of the third aspect of the disclosure.

BRIEF DESCRIPTION OF THE DRAWINGS

In order that the present disclosure may be better understood, embodiments thereof will now be described, by way of example only, with reference to the accompanying drawings in which:

FIG. 2 is a schematic diagram of a wireless telecommunications network of an embodiment of the present disclosure, including an RF receiver.

FIG. 4a is a graph illustrating modulation depth as a function of coupling detuning for a range of RF detunings.

FIG. 4b is a graph illustrating the impact of varying coupling power on modulation depth, once coupling detuning is optimized to RF detuning with coupling intensity set to $\Omega_c^2 = \Gamma 2\Gamma 3$ (0 dB).

DETAILED DESCRIPTION

Figure 1:
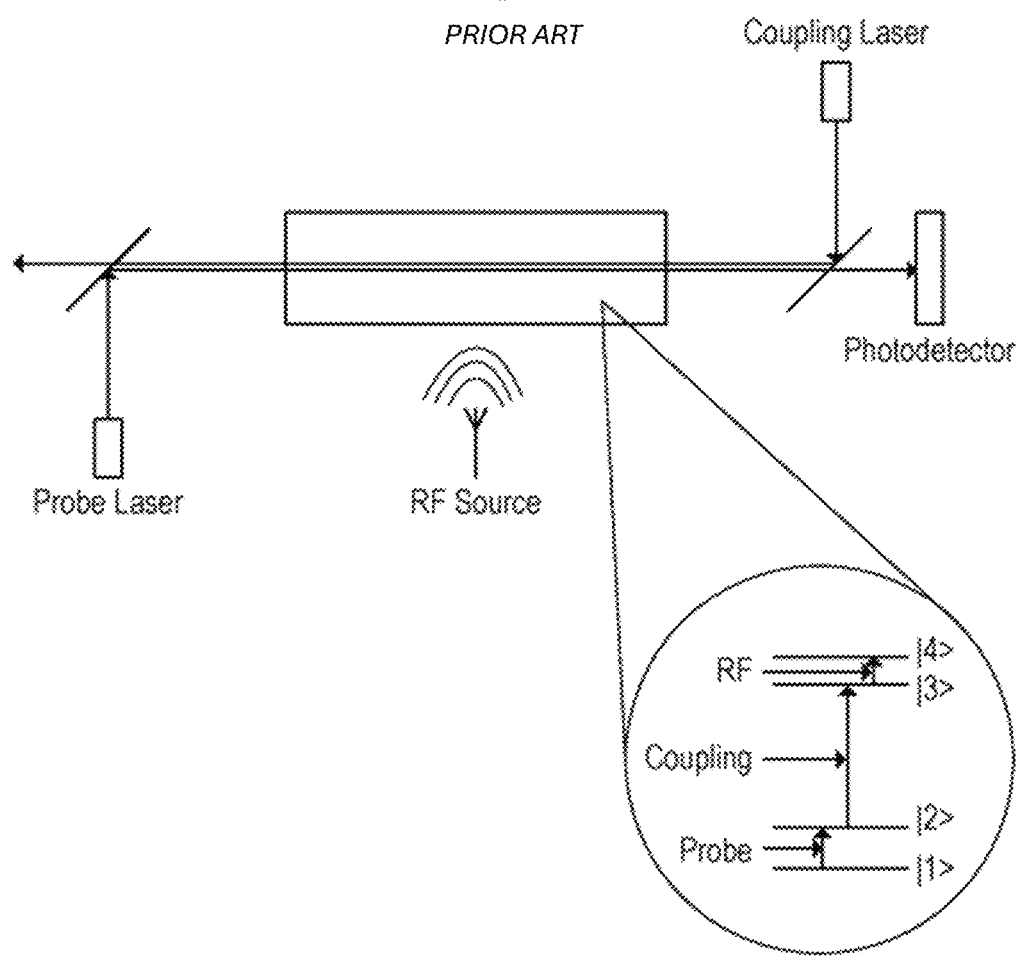
FIG. 1 is a schematic diagram of a conventional Radio-Frequency (RF) receiver.

A first embodiment of a wireless telecommunications network 1 of the present disclosure will now be described. As shown in FIG. 2, the wireless telecommunications network 1 includes a wireless transmitter 10 and a Radio-Frequency (RF) receiver 20. In this embodiment, the wireless transmitter 10 is configured to transmit wireless signals at a frequency of 3.5 GHz and at a transmission power of 1 mW, and the wireless transmitter 10 and RF receiver 20 are 250 km apart. The RF receiver 20 is a Rydberg-atom based RF receiver and includes an optical fiber 21, a probe laser 23, a coupling laser 25 and a photodetector 27. The RF receiver 20 also includes a processor 29 for processing the received signal data of the photodetector 27. The optical fiber 21 includes an optical cavity containing a vapor of alkali metal (in this embodiment, Rubidium-85).

In this embodiment, the RF receiver 20 is configured to detect the 3.5 GHz wireless signals transmitted by the wireless transmitter 10. To achieve this, the probe laser 23 of the RF receiver 20 transmits a probe signal along the optical fiber 21, through the optical cavity of Rubidium-85 vapor. Furthermore, the coupling laser 25 of the RF receiver 20 transmits a coupling signal along the optical fiber 21, through the optical cavity of Rubidium-85 vapor. The frequency of the probe signal is set to correlate with the transition of an electron of a Rubidium-85 atom from a ground state to a first excited state, and the frequency of the coupling signal is set to correlate with the transition of an electron of a Rubidium-85 atom from the first excited state to a predetermined Rydberg state. In this embodiment in which the RF receiver 20 is configured to detect 3.5 GHz wireless signals, which is the 84$^{th}$ principal quantum number energy state. In this configuration, wireless signals transmitted by the wireless transmitter at 3.5 GHz that pass through the optical cavity of the optical fiber 21 will excite electrons from this predetermined Rydberg state to an adjacent Rydberg state, causing an Electromagnetically Induced Transparency (EIT) signal in the monitored probe signal at the photodetector 27. A difference between a depth of the EIT signal when there is an incident wireless signal from the wireless transmitter 10 and where there is no incident wireless signal from the wireless transmitter 10 is the "modulation depth".

The RF receiver 20 also has a controller 22 for controlling a frequency of the probe signal (i.e. to adjust or stabilize the frequency of the probe signal), for controlling a frequency of the coupling signal (i.e. to adjust or stabilize the frequency of the coupling signal), for controlling an intensity of the probe laser 23 (i.e. the transmission power and/or cross-sectional area of the probe laser 23), and for controlling an intensity of the coupling laser 25 (i.e. the transmission power and/or cross-sectional area of the coupling laser 25). The controller 22 also includes a processor module and a memory module, wherein the memory module is configured to store values for various measurements of the RF receiver 20 (described below) and the processor module is configured to analyze these measurements (also described below). In this embodiment, the controller 22 utilizes a Pound-Drever-Hall (PDH) stabilizing mechanism for stabilizing the frequencies of the probe and coupling signals, and utilizes an Acousto-Optic Modulator (AOM) stabilizing mechanism for stabilizing the intensity of the probe and coupling lasers 23, 25.

Figure 3:
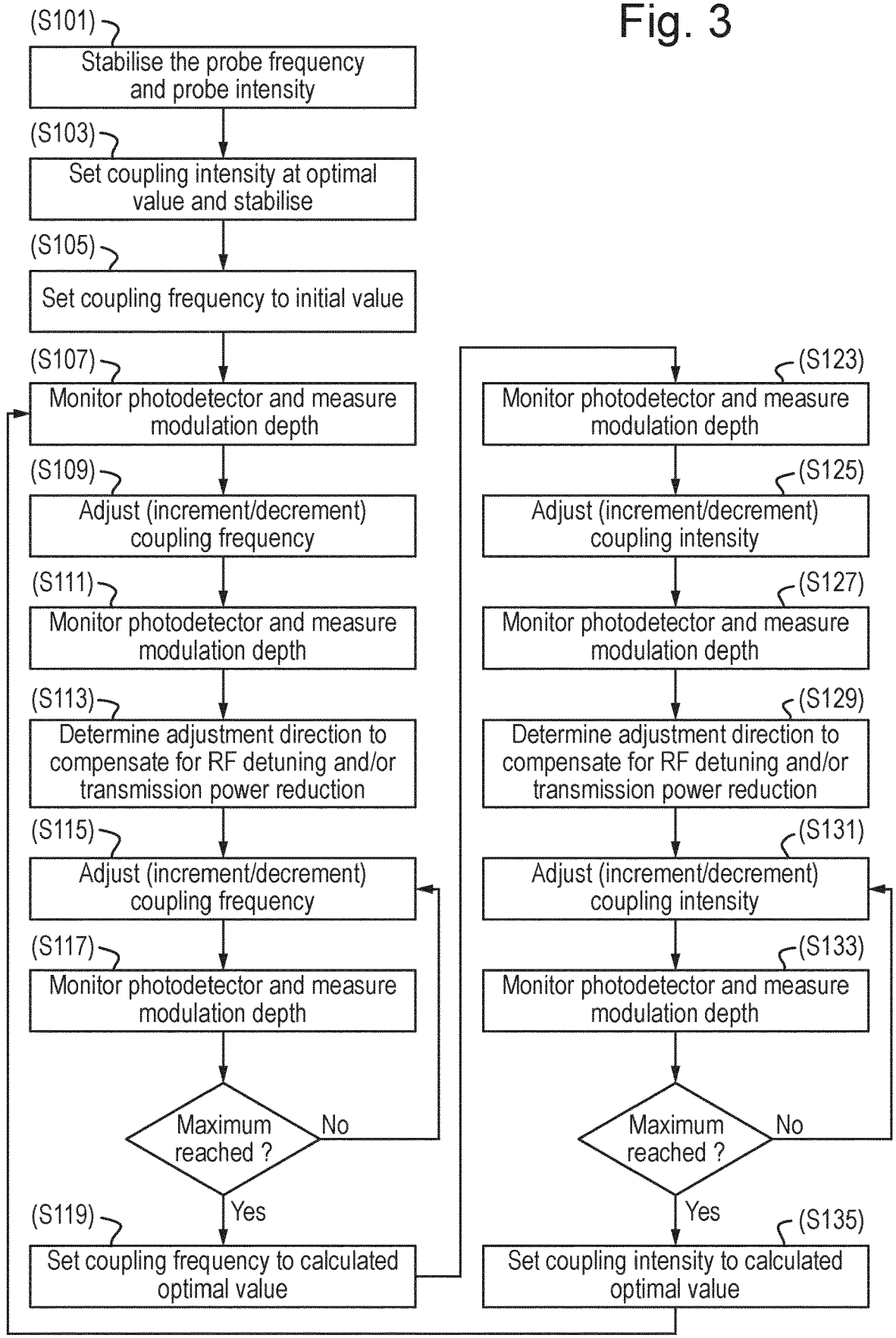
FIG. 3 is a flow diagram illustrating an embodiment of a method of the present disclosure.

A first embodiment of a method of the present disclosure will now be described with reference to FIG. 3. This first embodiment adjusts certain parameters of the coupling laser to improve the modulation depth (that is, increase the modulation depth relative to the modulation depth if no action is taken) in response to the frequency of the wireless transmitter 10 signals deviating from 3.5 GHz and/or the transmission power of the wireless transmitter 10 being reduced from 1 mW. A deviation between a target frequency and a frequency of the transmitted signal is known as "detuning", and in this particular instance when it applies to the wireless transmitter's signal deviating from the target frequency, it is known as "RF detuning". This RF detuning may occur due to, for example, frequency drift in the antenna and Doppler shift. This RF detuning can lead to a reduction in the modulation depth at the photodetector, which is undesirable. Furthermore, any reduction in the transmission power of the wireless transmitter 10 also leads to a reduction in the modulation depth at the photodetector. This reduction may occur due to, for example, free-space loss or multi-path interference. To solve this problem, this embodiment proposes a solution by adjusting parameters of the coupling laser so as to maximize (or at least improve) the modulation depth without knowing the RF detuning of the signal transmitted by the wireless transmitter 10 or a change in transmission power of the wireless transmitter 10.

In S101 (as shown in the flow diagram of FIG. 3), the controller 22 stabilizes the frequency of the probe signal (which is configured for exciting electrons of the Rubidium-85 atom from the ground state to the first excited state) and the intensity of the probe laser 23.

In S103, the intensity of the coupling laser 25 is set at the optimum value for the transition of electrons from the first excited state to the predetermined (that is, 84$^{th}$ principal quantum number) Rydberg state, and the stabilized at this intensity. This intensity is calculated so that:

$$\Omega_c^2 = \Gamma_2 \Gamma_3$$

In which:

$\Omega_c$ is the Rabi frequency of the coupling signal, which is the product of the E-field amplitude and the dipole moment (of the transition from the first excited state to the predetermined Rydberg state) divided by the reduced Planck constant, $\Gamma_2$ is the transition rate of electrons transitioning from the first excited state to the ground state, and $\Gamma_3$ is the transition rate of electrons transitioning from the predetermined Rydberg state to the first excited state.

Accordingly, as $\Omega_c^2$ is proportional to the E-field of the coupling laser 25, the optimal intensity of the coupling laser 25 may be determined by combining $\Omega_c^2$ with the beam width of coupling laser 25 and the relevant dipole moment for the transition from the first excited state to the predetermined Rydberg state so that it is equal to $\Gamma_2\Gamma_3$. This value may also be determined experimentally (e.g. in an initial calibration) by setting the probe, coupling and RF frequencies to resonance, then for high powers of RF measuring the value of coupling power at which the modulation depth is maximum, then iteratively reducing the RF power and measuring the optimum coupling power. The coupling power that corresponds to $\Omega_c^2 = \Gamma_2\Gamma_3$ will be the extrapolated coupling power for zero RF power.

In S105, the coupling frequency (that is, the frequency of the coupling signal transmitted by the coupling laser 25) is set to a value required to transition electrons from the first exited state to the predetermined Rydberg state (assuming that there is no RF detuning at this stage).

At this stage, the RF receiver is configured to detect 3.5 GHz wireless signals transmitted by the wireless transmitter 10. On receipt of these wireless signals, the photodetector 29 experiences a drop in amplitude of the probe signals (compared to the probe signal amplitude when there is no wireless signal incident on the RF receiver 20), wherein the drop in amplitude is known as the "modulation depth"). In S107, the processor 29, monitoring the signal of the photodetector 27, measures the modulation depth and records both the value of the coupling detuning at the time of this measurement and the value of the measured modulation depth in memory. As noted above, a "detuning" is a deviation between a reference frequency and a frequency of the transmitted signal. For this coupling signal, the reference frequency is that required to transition electrons from the first exited state to the predetermined Rydberg state (assuming zero RF detuning). Accordingly, the "coupling detuning" is the deviation between the reference frequency of the coupling signal (set in S105) and the actual frequency of the signal transmitted by the coupling laser 25. In this initial phase of this embodiment, where the controller 22 of the coupling laser 25 is sufficiently accurate so that any deviation from the reference frequency is negligible, the recorded value for the coupling detuning is zero.

In S109, the controller 22 adjusts the frequency of the coupling signal by a predetermined adjustment value (in this embodiment, 100 Hz) in a first direction (in this embodiment, an increment so that the frequency of the coupling signal is the value determined in S105 plus 100 Hz). The controller 22 has therefore introduced a coupling detuning to the RF receiver 20 of +100 Hz relative to the reference frequency. It is shown (below) that this causes a change in the modulation depth of the probe signal, which can be used as feedback to adjust the frequency of the coupling signal to compensate for any RF detuning and/or changes in transmission power of the wireless signal of the wireless transmitter 10 (that is, to maximize or at least increase the modulation depth, which would otherwise decrease as a result of the RF detuning and/or changes in transmission power).

In S111, the processor 29 measures the modulation depth with the new frequency of the coupling signal (that is, the frequency of the coupling signal following the adjustment at S109). The value of the coupling detuning at the time of the measurement (+100 Hz) and the value of the modulation depth are recorded in memory.

In S113, the controller's processor module analyses the values recorded in S105 and S111 (those recorded when the coupling detuning was zero and +100 Hz respectively) to characterize a change in modulation depth following the increment of 100 Hz. If the modulation depth increased as a result of this increment, then it is determined that there is an RF detuning of the wireless signal and/or reduction in transmission power of the wireless transmitter 10 and that the adjustment to increment the coupling detuning compensated for that RF detuning and/or reduction in transmission power. The controller 22 may react to such a result of this analysis by further incrementing the coupling detuning (as described in subsequent operations of this method). If the modulation depth decreased as a result of this increment, then there are two possible conclusions: 1) there was no RF detuning or reduction in transmission power of the wireless transmitter 10 such that the increment in coupling detuning reduced the modulation depth from its maximum value, or 2) there was RF detuning and/or a reduction in transmission power of the wireless transmitter 10 but the adjustment to increment the coupling detuning did not compensate for it. The controller 22 may react to such a result of this analysis by decrementing the coupling detuning (as described in subsequent operations of this method). Accordingly, this analysis determines the direction for coupling signal frequency adjustments (being either the first direction to increment the frequency or a second direction to decrement the frequency) that result in a modulation depth increase.

In S115, the controller 22 adjusts the frequency of the coupling signal based on the results of the analysis in S113. That is, if the modulation depth increased as a result of the previous adjustment, then the controller 22 adjusts the frequency by the predetermined adjustment amount in the first direction (that is, a further increment); and if the modulation depth decreased as a result of the previous adjustment, then the controller 22 adjusts the frequency by the predetermined adjustment amount in the second direction (i.e. a decrement of −100 Hz). Following this new adjustment, in S117, the processor 29 measures the new modulation depth and records the value of the coupling detuning and the measured modulation depth value.

S115 and S117 are repeated in an iterative manner until a termination condition is met in which the modulation depth does not increase (i.e. no change or a decrease in modulation depth) following the frequency adjustment. Then, in S119, an optimal frequency for the coupling signal is calculated by interpolating the recorded values of the coupling detuning and the corresponding measured modulation depth values and the controller 22 sets the value of the frequency of the coupling signal at this calculated optimal value. The coupling signal is thereafter stabilized at this calculated optimal value by the controller 22.

In S123, the processor 29 measures the modulation depth with the frequency of the coupling signal being the calculated optimal value and with the intensity being that calculated in S103. These values are recorded in memory. In S125, the controller 22 adjusts the intensity of the coupling laser 25 (from the value set in S103 above) by a particular adjustment amount (1 dB) in a first direction (in this embodiment, an increment so that the intensity of the coupling laser 25 is the value determined in S103 plus 1 dB). It is also shown (below) that this causes a change in the modulation depth of the probe signal, which can be used as feedback to adjust the intensity of the coupling laser 25 to compensate for any RF detuning and/or changes in transmission power of the wireless signal of the wireless transmitter 10 (that is, to maximize or at least increase the modulation depth, which would otherwise decrease as a result of the RF detuning and/or changes in transmission power).

In S127, the processor 29 measures the modulation depth with the new intensity of the coupling laser 25. The value of the intensity of the coupling laser 25 at the time of the measurement (+1 dB) and the value of the modulation depth are recorded in memory.

In S129, the controller's processor module analyses the values recorded in S123 and S127 (those recorded when the intensity was at the value calculated in 103 and +1 dB respectively) to characterize a change in modulation depth following the increment of +1 dB. If the modulation depth increased as a result of this increment, then it is determined that there is an RF detuning of the wireless signal and/or reduction in transmission power of the wireless transmitter 10 and that the adjustment to increment the intensity of the coupling laser 25 compensated for that RF detuning and/or reduction in transmission power. The controller 22 may react to such a result of this analysis by further incrementing the intensity of the coupling laser 25 (as described in subsequent operations of this method). If the modulation depth decreased as a result of this increment, then there are two possible conclusions: 1) there was no RF detuning or reduction in transmission power of the wireless transmitter 10 such that the increment in intensity of the coupling laser 25 reduced the modulation depth from its maximum value, or 2) there was RF detuning and/or a reduction in transmission power of the wireless transmitter 10 but the adjustment to increment the intensity of the coupling laser 25 did not compensate for it. The controller 22 may react to such a result of this analysis by decrementing the intensity of the coupling laser 25 (as described in subsequent operations of this method). Accordingly, this analysis determines the direction for coupling laser intensity adjustments (being either the first direction to increment the intensity or a second direction to decrement the intensity) that result in a modulation depth increase.

In S131, the controller 22 adjusts the intensity of the coupling laser 25 based on the results of the analysis in S129. That is, if the modulation depth increased as a result of the previous adjustment, then the controller 22 adjusts the intensity by the predetermined adjustment amount in the first direction (that is, a further increment); and if the modulation depth decreased as a result of the previous adjustment, then the controller 22 adjusts the intensity by the predetermined adjustment amount in the second direction (i.e. a decrement of −1 dB). Following this new adjustment, in S133, the controller 22 measures the new modulation depth and records the value of the intensity of the coupling laser 25 and the measured modulation depth value.

S131 and S133 are repeated in an iterative manner until a termination condition is met in which the modulation depth does not increase (i.e. no change or a decrease in modulation depth) following the intensity adjustment. Then, in S135, an optimal intensity for the coupling laser 25 is calculated by interpolating the recorded values of the intensity of the coupling laser 25 and the corresponding measured modulation depth values and the controller 22 sets the value of the intensity of the coupling laser 25 at this calculated optimal value. The coupling laser 25 is thereafter stabilized at this calculated optimal value by the controller 22.

The process then loops back to S107 to track any further changes in RF detuning and/or transmission power of the wireless transmitter 10 and maximize (or at least increase) the modulation depth in response. The process may also loop back to S103 should the RF receiver 20 be reconfigured to detect wireless signals at different frequencies.

The above embodiment provides a process of introducing feedback loops into the RF receiver 20 so that the modulation depth may be maximized or at least increased. These feedback loops include a first feedback loop based on a relationship between the modulation depth and the coupling detuning, and a second feedback loop based on a relationship between the modulation depth and the intensity of the coupling laser 25. It can be advantageous to perform the first feedback loop before the second feedback loop, as there is a stronger relationship between the modulation depth and the coupling detuning than between the modulation depth and the intensity of the coupling laser 25 (that is, there are greater changes in the modulation depth as a result of the frequency adjustment than the intensity adjustment). These relationships will now be described in the example of a ladder EIT configuration (which is relevant to the embodiment above using a Rubidium-85 atomic medium).

The present inventors have derived the electric susceptibility, X, for a low-density atomic vapor with the ladder EIT configuration as:

$$\chi = -(2N|\wp_{12}|^2/\varepsilon_0\hbar)\{(2(\Delta_p+\Delta_c)+i\Gamma_3)(2(\Delta_p+\Delta_c+\Delta_r)+i\Gamma_4)-\Omega_r^2\}/[\{(2(\Delta_p+\Delta_c)+i\Gamma_3)(2(\Delta_p+\Delta_c+\Delta_r)+i\Gamma_4)-\Omega_r^2\}(2\Delta_p+i\Gamma_2)-\Omega_c^2(2(\Delta_p+\Delta_c+\Delta_r)+i\Gamma_4)] \quad \{Eq\ 1\}$$

In which:

N is the number of atoms engaged in the interaction, $|\wp_{12}|$ is the transition dipole moment of the first transition (between the ground state and the first excited state), $\varepsilon_0$ is the electric permittivity of free space, $\hbar$ is the reduced Planck constant, $\Delta_p$, $\Delta_c$, and $\Delta_r$ are the differences in angular frequency of the probe, coupling and RF signals to their corresponding resonant atomic transition frequencies (that is, the frequency required to elevate an electron from the ground state to the first excited state, the frequency required to elevate an electron from the first excited state to the predetermined Rydberg state, and the frequency required to elevate an electron from the predetermined Rydberg state to the adjacent Rydberg state), $\Gamma_2$, $\Gamma_3$ and $\Gamma_4$ are the transition rates out of the first excited state, the predetermined Rydberg state, and the adjacent Rydberg state respectively, and $\Omega_r$ and $\Omega_c$ are the Rabi frequencies of the RF and coupling signals, which is the product of the E-field amplitude and the relevant transition dipole moment divided by the reduced Planck constant.

The absorbance of the medium is described by the imaginary part of this complex electric susceptibility, and is a lengthier expression when written out in full, so it is useful to define some intermediate expressions in order to keep the final expression manageable:

Let:

$$B = \Gamma_3\Gamma_4 - 4(\Delta_p+\Delta_c)(\Delta_p+\Delta_c+\Delta_r) + \Omega_r^2$$

$$C = \Gamma_3(\Delta_p + \Delta_c + \Delta_r) + \Gamma_4(\Delta_p + \Delta_c)$$

$$S = \Omega_c^2 \Gamma_4 + B\Gamma_2 - 4\Delta_p C$$

$$T = \Omega_c^2(\Delta_p + \Delta_c + \Delta_r) + C\Gamma_2 + \Delta_p B$$

So the absorbance, which is the imaginary part of the electric susceptibility, is given by:

$$\Im(\chi) = (2N|\wp_{12}|^2/\varepsilon_0 \hbar)(BS + 4CT)/(S^2 + 4T^2)$$

The absorbance determines the proportion of the incident probe intensity that is transmitted through a length L of the optical cavity containing the Rubidium-85 vapor (specifically, the region within the optical cavity where the probe and coupling lasers overlap):

$$\text{Probe transmission} \sim \exp(-\Im(\chi) 2\pi L/\lambda_p)$$

where $\lambda_p$ is the probe wavelength.

These equations demonstrate that the modulation depth of the probe signal, as detected by the photodetector 27 of the RF receiver 20, is a function of the coupling laser intensity, the RF signal intensity, the coupling frequency, and the RF frequency.

Assuming the simplest possible digital modulation scheme, On-Off Keying represents digital data with the presence or absence of the RF signal. The presence of the RF signal for a specific duration represents a binary one, while its absence for the same duration represents a binary zero. So the modulation depth of the probe signal will be the difference in the transmitted optical intensity detected by the photodetector 27 when the RF signal is on and when it is off. It is assumed here that the modulation rate of the RF signal is sufficiently slow to allow the EIT effect to reach a steady state between each bit of data transmission.

For a diffuse vapor, the EIT effect is small and the value of the absorbance is also small, so to a good approximation the modulation depth is simply proportional to the difference in the absorbance when the RF intensity is at its maximum and when it is zero:

$$M \sim \Im(\chi(\Omega_r)) - \Im(\Omega(0))$$

With the probe laser stabilized to the frequency required to elevate electrons from the ground state to the first excited state, but with both the coupling and RF frequencies allowed to be off-resonant (i.e. not at the value required to elevate electrons from the first excited state to the predetermined Rydberg state and from the predetermined Rydberg state to the adjacent Rydberg state respectively), then it can be shown that $$(S_0^2 + 4T^2)(S^2 + 4T^2)M = \Omega_r^2 \Omega_c^2 \{\Gamma_4(S_0 S - 4T^2) + 4(\Delta_c + \Delta_r)(S + S_0)T\} \quad \{Eq\ 2\}$$

By differentiating this expression with respect to $\Omega_c^2$ it can be shown that the maximum modulation depth M occurs at:

$$(S_0^2 + 4T^2)(S^2 + 4T^2)[\{\Gamma_4(S_0 S - 4T^2) + 4(\Delta_c + \Delta_r)(S + S_0)T\} + \Omega_c^2\{\Gamma_4 + 4(\Delta_c + \Delta_r)^2\}(S_0 + S)] = 2\Gamma_4 \Omega_c^2 \{\Gamma_4(S_0 S - 4T^2) + 4(\Delta_c + \Delta_r)(S + S_0)T\}(S_0 S - 4T^2)(S_0 + S) + 4(\Delta_c + \Delta_r)T(S^2 + S_0^2 + 8T^2) \quad \{Eq\ 3\}$$

This expression is a cubic in each of four variables ($\Delta_c$, $\Delta_r$, $\Omega_r$, $\Omega_c$) so is computationally hard to solve but simplifies on full resonance ($\Delta_p = \Delta_c = \Delta_r = 0$) to a much simpler relationship:

$$\Omega_c^4 = \Gamma_2 \Gamma_3 (\Omega_r^2 + \Gamma_3 \Gamma_4)/\Gamma_4 \quad \{Eq\ 4\}$$

Similarly when both $\Omega_r$ and ($\Delta_c = \Delta_r$) are small, so that the RF intensity is low and the coupling detuning is close to being equal and opposite to the RF detuning, then it can be shown that the maximum modulation depth M occurs at:

$$4\Gamma_2^2 \Delta_r^2 = 3\Omega_c^2(\Omega_c^2 + \Gamma_2 \Gamma_3) - \{(3\Omega_c^2(\Omega_c^2 + \Gamma_2 \Gamma_3))^2 - (\Omega_c^2 - \Gamma_2 \Gamma_3)(\Omega_c^2 + \Gamma_2 \Gamma_3)^3\}^{1/2} \quad \{Eq\ 5\}$$

So for any particular RF detuning and RF intensity at the Rydberg receiver 20, there is an optimum value of the coupling detuning and intensity of the coupler laser 25 which can be calculated using a lengthy cubic expression shown in Eq 3. This calculation takes this much simpler form, shown in Eq 5, for the special case of a weak RF signal and when the coupling detuning is close to balancing the RF detuning.

So for any RF signal frequency and intensity, there is an optimum coupling frequency and coupling intensity that is determined by the specific transition frequencies, transition rates and dipole moments of each resonance. For the general case of an RF signal between resonances, the total absorbance is the sum of the off-resonant absorbances for the adjacent RF transitions.

FIG. 4a shows how the modulation depth varies as a function of the coupling detuning, assuming a very weak RF transmission of 1 mW (0 dBm) from a distance of 250 km, with an RF frequency either side of the n=84 transition of 3.46 GHz in Rubidium. The coupling laser intensity is set at $\Omega_c^2 = \Gamma_2 \Gamma_3$ which would be the optimum in the limit of small RF intensity. The two points to notice from the curves in FIG. 4a are that:

When RF detuning is positive, the gradient of the modulation depth is negative and vice versa, When moving coupling detuning in the positive direction, the modulation maximum is approached with a positive gradient which drops to zero gradient at the maximum itself and then become negative—which is true of all maxima.

Accordingly, by following S101 to S119 of the embodiment of the method of the present disclosure (described in detail above) for an unknown RF detuning and intensity, the coupling intensity is first set to $\Omega_c^2 = \Gamma_2 \Gamma_3$ which assumes that the RF intensity is very weak. Then starting with the coupling detuning at zero, the modulation depth is measured. The coupling detuning is then increased by a small increment, such as 100 Hz or less and the modulation depth is measured again. If the modulation depth has decreased with increased coupling detuning (negative gradient) then the RF detuning is positive and vice versa. The coupling detuning should be incremented (or decremented) in the direction of increasing modulation depth until the gradient falls to zero or becomes negative. The position of the maximum can be interpolated given the coupling detuning and modulation depth values on either side of it. Now at this point the coupling detuning has been optimized for a non-optimum choice of coupling intensity.

FIG. 4b shows the impact of varying coupling power on modulation depth, once coupling detuning is optimized to RF detuning with coupling intensity set to $\Omega_c^2 = \Gamma_2 \Gamma_3$ (0 dB). The two points to notice from the curves in FIG. 4b are that:

Modulation depth is never optimal for $\Omega_c^2 \neq \Gamma_2 \Gamma_3$

The optimal coupling intensity only increases slowly with larger magnitude of coupling detuning and has a small impact on the modulation depth.

Accordingly, the modulation depth is most sensitive to the coupling detuning, with only a weak dependence on the coupling intensity (that is, unless the adjustment size for the coupling intensity is relatively fine compared to the adjustment size for the coupling frequency so that coupling intensity changes cause greater changes in modulation depth).

The following description is a numerical example for a system having a wireless transmitter 10 transmitting a wireless signal at 30 µV/m. For a spherical RF field with radius of $R_r$ and power $P_r$, the intensity is:

$$I_r = P_r/4\pi R_r^2$$

which is related to the electric field by:

$$I_r = (1/2Z_0)E_r^2$$

where $Z_0 = 376.73\Omega$, the characteristic impedance of vacuum.

The RF Rabi frequency is given by:

$$\Omega_r = E_r(\rho_{34}/\hbar)$$

For a Gaussian coupling beam with $1/e^2$ radius of $R_c$ and power $P_c$, the intensity is:

$$I_c = 2P_c/\pi R_c^2$$

which is related to the electric field by $I_c = (1/2Z_0)E_c^2$.
So, $$E_c^2 = P_c(4Z_0/\pi R_c^2)$$

The Coupling Rabi frequency is given by:

$$\Omega_c = E_r(\rho_{23}/\hbar)$$

So, $$\Omega_c^2 = E_r^2(\rho_{23}/\hbar)^2 = P_c(4Z_0/\pi R_c^2)(\rho_{23}/\hbar)^2$$

Accordingly, $$E_r = 3\times10^{-5} \text{ V/m}$$

$$I_r = 1.194\times10^{-12} \text{ W/m}^2$$

$$P_r/R_r^2 = 1.5\times10^{-11}$$

(which could for instance be a 1 Watt transmission from 258 km, or equivalently a 15 microwatt transmission from 1 km away)

For the n=84 resonance in Rubidium (Rb 84D_{5/2}->85P_{3/2}) at 3.46 GHz:

$$\Omega_r = 17,000\times2\pi \text{ Hz}$$

Figure 5A:
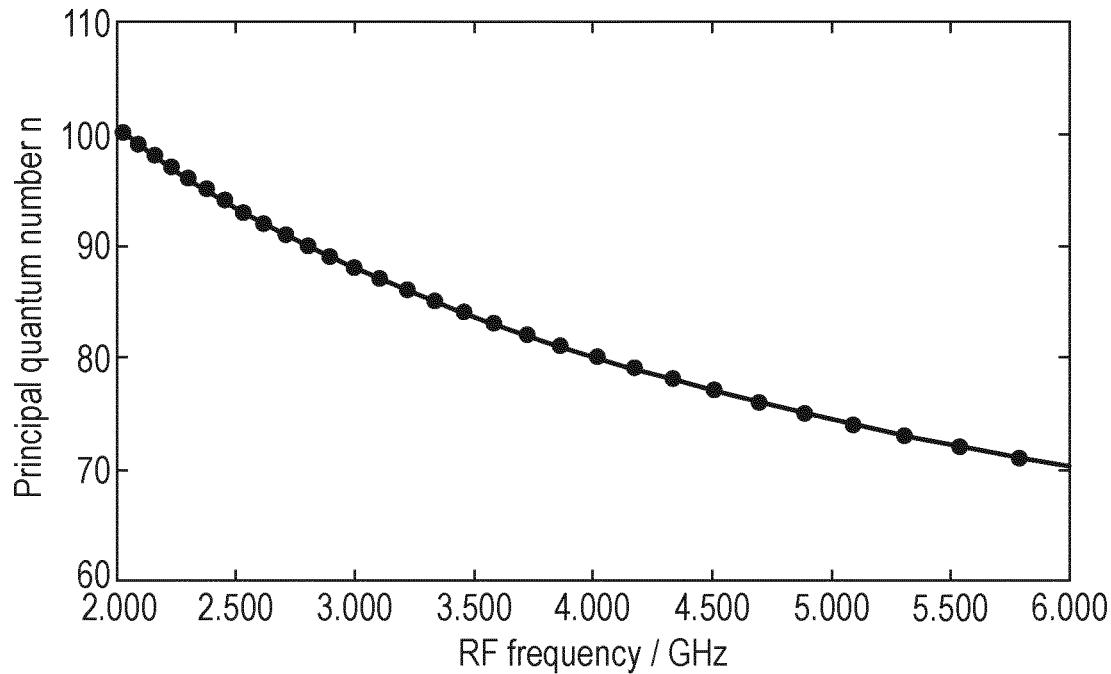
FIG. 5a is a graph illustrating how resonant RF frequency varies with principal quantum number n.
Figure 5B:
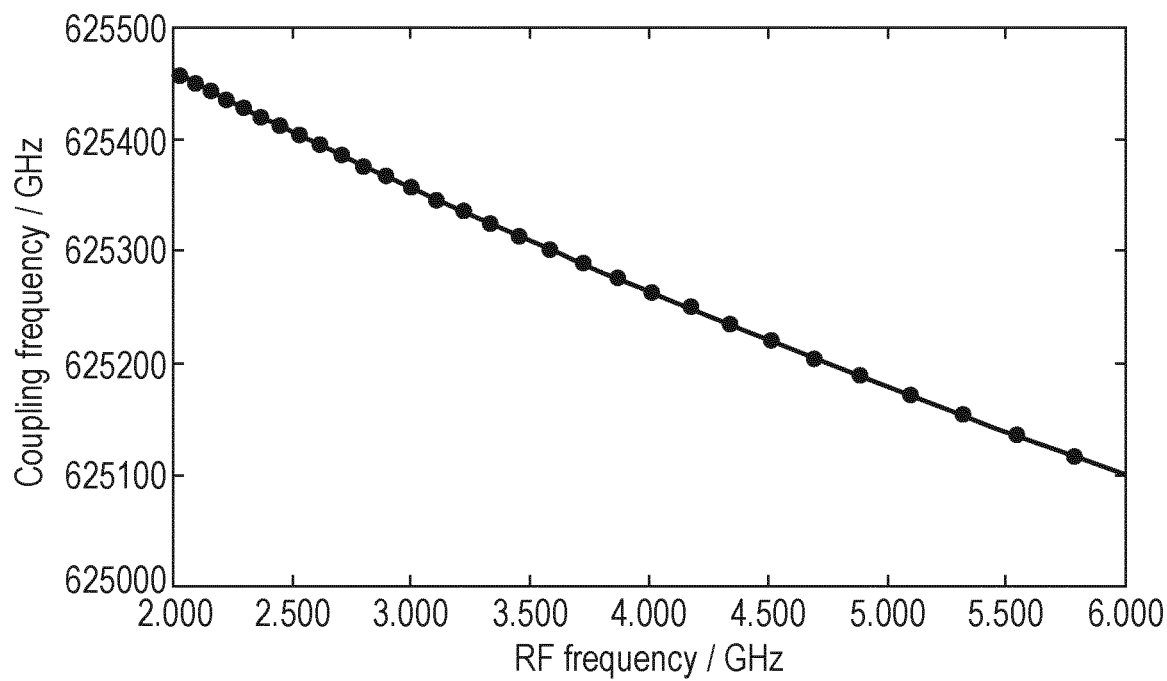
FIG. 5b is a graph illustrating how resonant RF frequency varies with coupling frequency.

FIG. 5a is graph illustrating how resonant RF frequency varies with principal quantum number n, and FIG. 5b is a graph illustrating how resonant RF frequency varies with coupling frequency. The range n=70 to 100 is considered which covers RF resonances from 2 GHz to 6 GHz. A higher quantum number (excited electron state) is required to detect lower radio frequencies e.g. principal quantum number n=84 leads to a resonance at 3.5 GHz. Resonances near n=84 are separated by ~125 MHz in RF frequency and 11.7 GHz in coupling frequency, so the change in coupling frequency from one resonance to the next is ~100 greater than the change in RF frequency. However since the optical coupling frequency is so much larger than the RF frequency, the proportional change in coupling frequency between resonances is just ~0.002% whereas the proportional change in the RF frequency is ~4%.

Figure 6A:
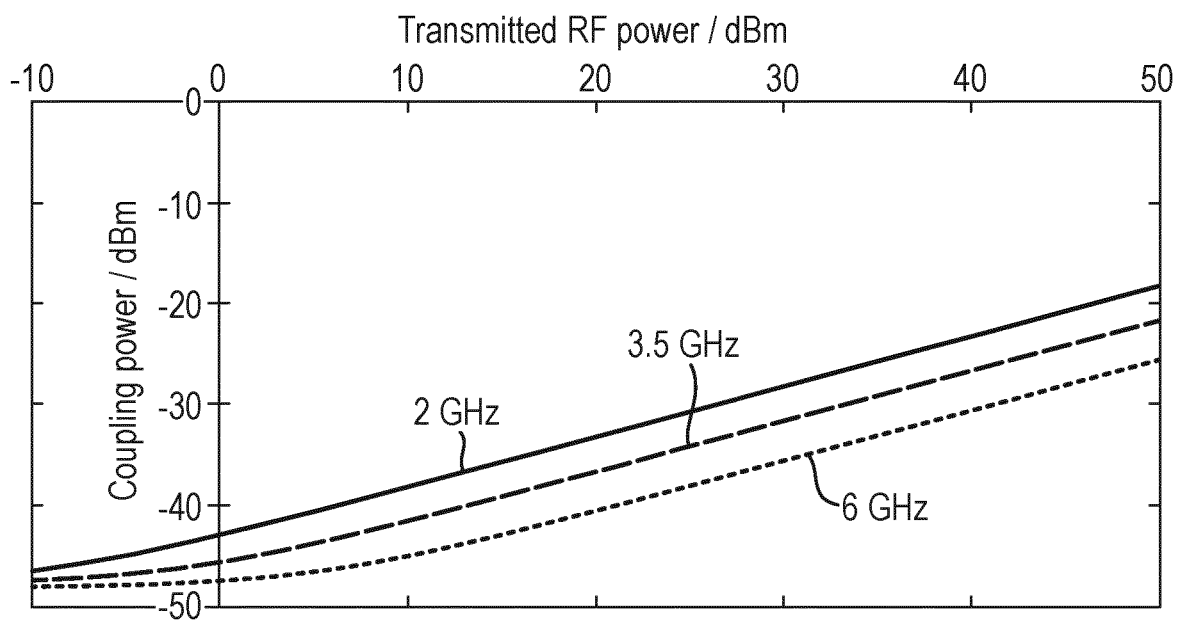
FIG. 6a is a graph illustrating how the optimized coupling power changes across three resonant RF frequencies.
Figure 6B:
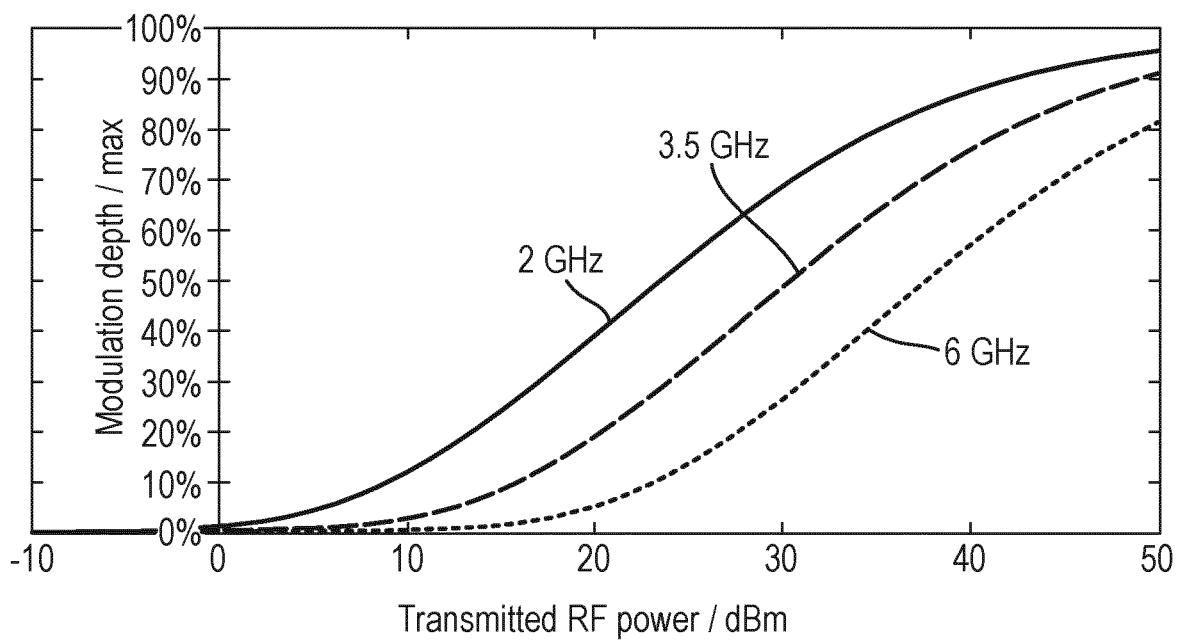
FIG. 6b is a graph illustrating how the optimized modulation depth changes across three resonant RF frequencies.

On resonance, the modulation depth is maximized when $\Omega_c^4 = \Gamma_2^2 \Gamma_3 (\Omega_r^2 + \Gamma_3 \Gamma_4)/\Gamma_4$ where the values of $\Gamma_3$ and $\Gamma_4$ vary for each resonance. FIGS. 6a and 6b show how the optimized coupling power and optimized modulation depth both change across three resonant RF frequencies from 2.03 GHz (principal quantum number n=100) to 3.46 GHz (n=84) to 6.05 GHz (n=70). These graphs consider an RF source at a distance of 250 km from the receiver with a transmit power of ~1 W, so this is very long range detection. It is assumed that the coupling laser beam is constrained within the 10 micron radius core of a hollow-core-fiber which contains the Rubidium vapor.

Figure 7:
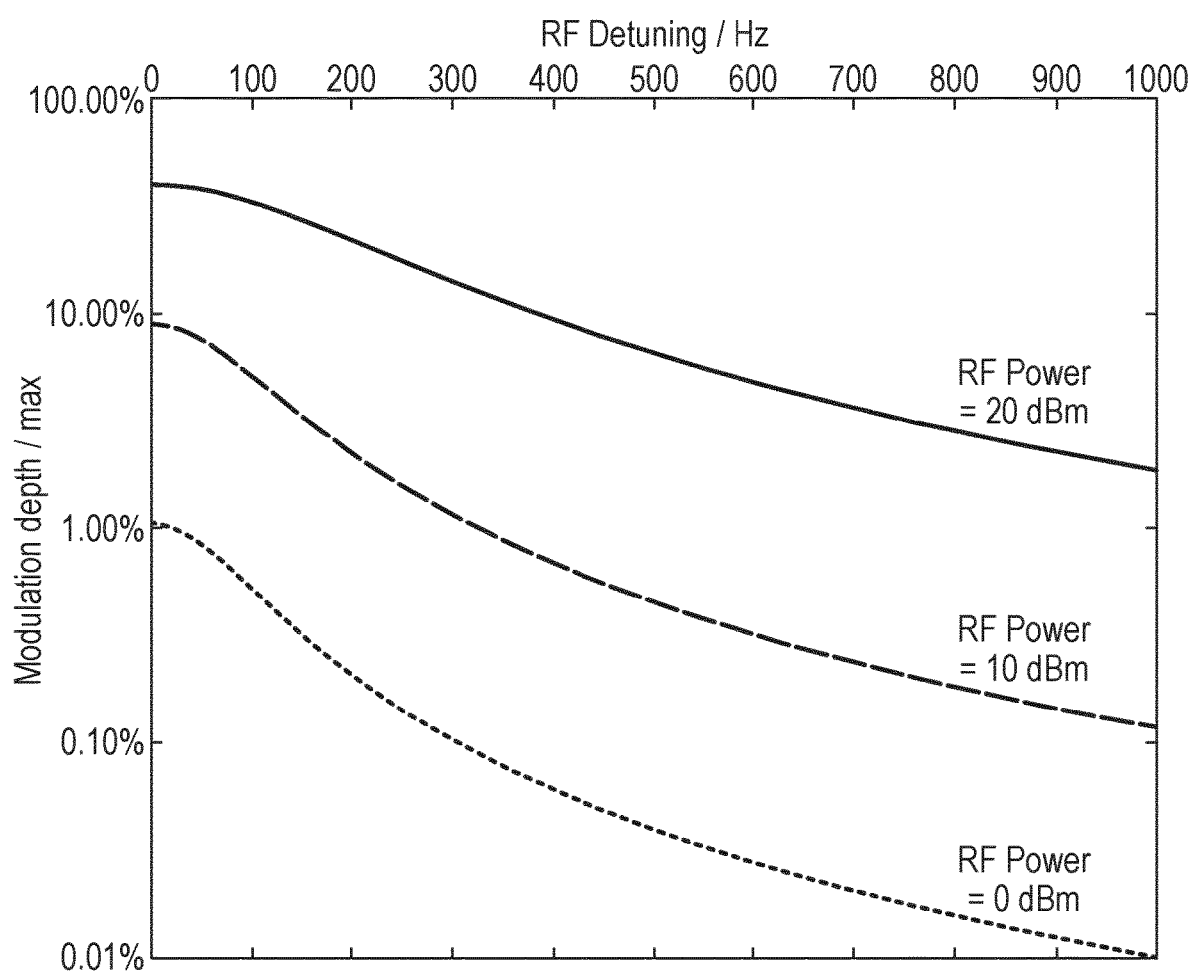
FIG. 7 is a graph illustrating how modulation depth varies as the RF frequency moves off resonance.

If all three frequencies (probe, coupling and RF) are resonant with their corresponding atomic transitions, then the only significant reason for the modulation depth to be sub-optimal is when the coupling intensity is not optimized to the RF intensity. However another reason for the modulation depth to be sub-optimal is if the RF frequency wanders off resonance, so that $\Delta_r \neq 0$. FIG. 7 shows an example for the n=84 resonance in Rubidium with a very weak RF transmission of 1 mW (0 dBm) from a distance of 250 km, the resonant modulation depth is still 1.06% of the high power maximum value, but the Full-Width-Half-Maximum (FWHM) with RF dephasing is a very narrow 196 Hz. So the receiver can only operate close to an RF resonance when the RF power is very low.

Figure 8A:
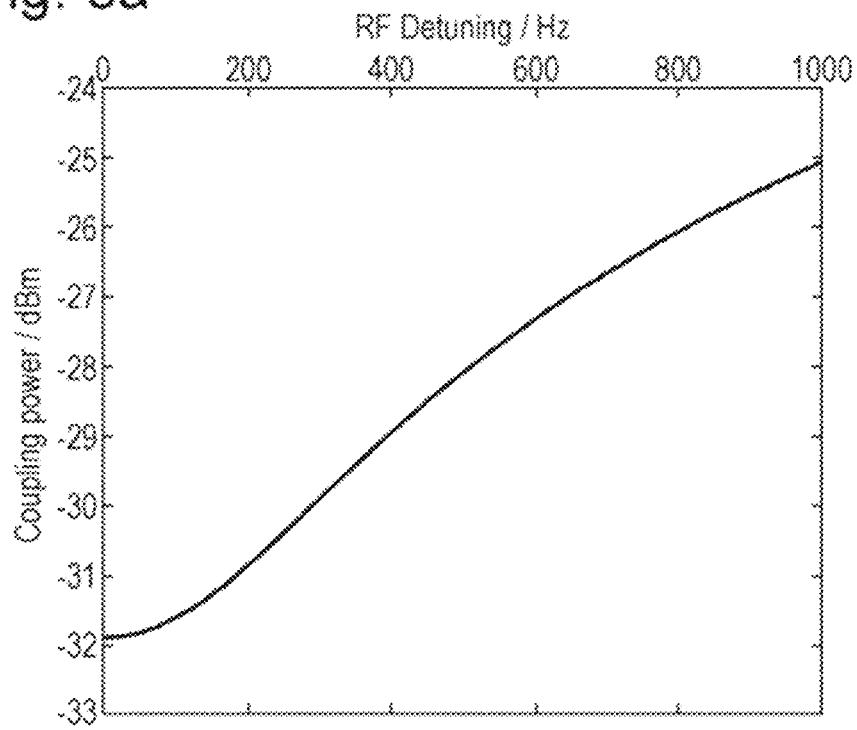
FIG. 8a is a graph illustrating optimum coupling power as a function of RF detuning for the case of low RF power and balanced coupling/RF detunings.
Figure 8B:
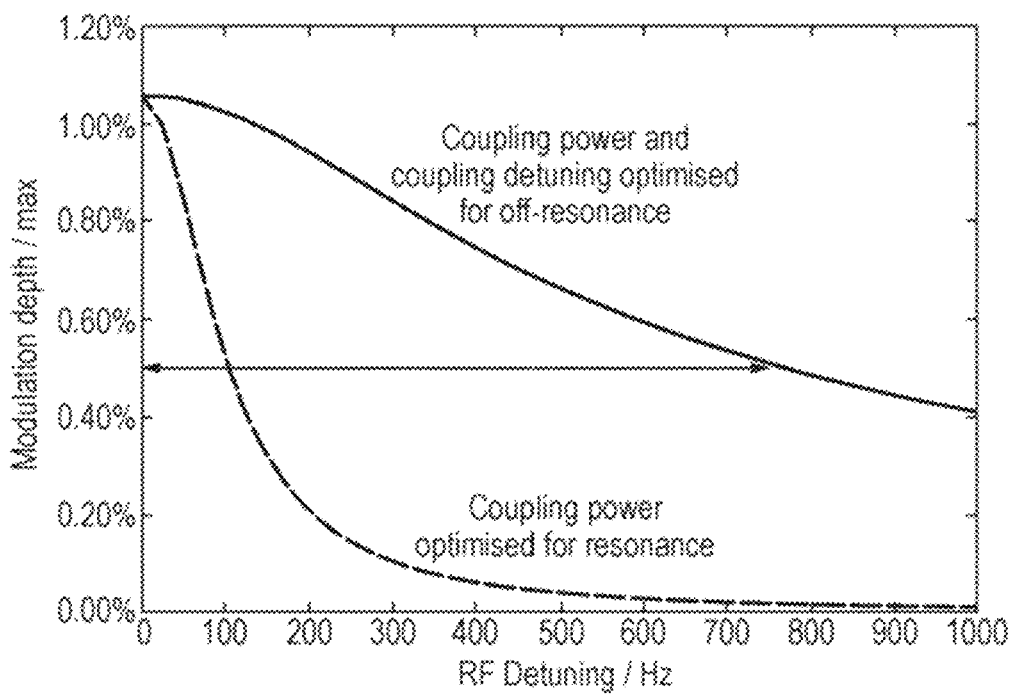
FIG. 8b is a graph illustrating how optimizing both coupling power and coupling detuning for off-resonant RF signal increases full width half maximum from 196 Hz to 1420 Hz.

However the receiver can operate over a much wider frequency range if, rather than holding the coupling frequency at resonance when the RF is off-resonant, the coupling frequency can be detuned to compensate and the coupling intensity can also be adjusted in line with the lengthy cubic expression presented above. FIG. 8a shows how the optimum coupling power varies as a function of the RF detuning for the special case of low RF power and balanced coupling/RF detunings, as described by Equation 5. It can be seen that the optimum coupling power needs to be increased as the RF signal moves away from resonance. A 1 mW RF signal from a distance of 250 km is equivalent to $\Omega_r^2 = 4\%\Gamma_3\Gamma_4$, so the simplifying assumptions of Equation 5 can be used. FIG. 8b shows the improvement that can be achieved by using this increased coupling power with RF detuning compared to simply using the resonant value. Optimizing both coupling power and coupling detuning for off-resonant RF signal increases FWHM from 196 Hz to 1420 Hz for this special case of a very weak RF signal (1 mW from 250 km distance). A receiver that is tunable across a FWHM of 1420 Hz can track the Doppler-shifted 3.5 GHz signal of a vehicle's transmitter moving radially from 0 m/s up to 122 m/s (270 mph), so this is a useful tuning range even at this extremely low RF transmit power.

So in general, when receiving an off-resonant RF signal, the modulation depth can be optimized by varying both coupling frequency and coupling power, but the modulation depth will not be as large as it is on-resonance and the tuning range is ultimately limited by the RF transmit power and the minimum detectable modulation depth.

The above embodiment illustrates an example system for detecting wireless signals of 3.5 GHz and a method to optimize the modulation depth of the Rydberg-atom based RF detector. However, the skilled person will understand that the above method may be applied to many other electromagnetic signals of different frequencies, and the 3.5 GHz signal is just an example. That is, for a particular target frequency, a system may be configured such that an EIT signal is produced on a probe signal by an incident electromagnetic signal at that target frequency (such as by selecting an appropriate atomic medium (e.g. Rubidium, Cesium or Strontium) having Rydberg states that correspond with that target frequency). Once the relevant principal quantum number is known, the values of the other physical quantities (resonant frequencies, transition rates, dipole moments) may be determined. Furthermore, it is also non-essential that the EIT signal is produced following a ladder configuration of electron transitions. That is, any configuration (e.g. Lambda, Vee) may be used.

In the above embodiment, a first feedback loop based on the relationship between modulation depth and coupling detuning was used first (to adjust the coupling frequency) before using a second feedback loop based on the relationship between modulation depth and intensity of the coupling laser (to adjust the intensity of the coupling laser). This is because, in most scenarios, coupling detuning will cause greater changes in the modulation depth than changes in intensity. However, this may not always be the case if the coupling frequency adjustments are relatively coarse compared to the intensity adjustments. Accordingly, there may be a preliminary set of operations before the first and second feedback loops in which the coupling frequency is adjusted by its smallest adjustment value from an initial state (e.g. following S105) and the modulation depth is recorded, the system is reset to the initial state, and then the intensity is adjusted by its smallest adjustment value from the initial state and the modulation depth is recorded. It may then be determined whether the coupling frequency or the intensity of the coupling laser should be adjusted in the first feedback loop based on whether the coupling frequency adjustment or the intensity adjustment caused the greatest change in modulation depth.

The skilled person will understand that any combination of features is possible within the scope of the disclosure, as claimed.

The invention claimed is:

1. A method of controlling an electromagnetic field detector comprising a first optical transmitter and a second optical transmitter, a transmission medium, and an optical receiver, wherein the first optical transmitter is configured to transmit a probe signal to the optical receiver via the transmission medium at a probe frequency and the second transmitter is configured to transmit a coupling signal via the transmission medium at a coupling frequency, wherein the probe frequency is set to excite electrons of the transmission medium from a ground state to a first excited state and the coupling frequency is set to excite electrons of the transmission medium to a predetermined excited state so as to induce an Electromagnetic Induced Transparency (EIT) effect in the electromagnetic field detector such that an incident electromagnetic field at the transmission medium causes a detectable change in power of the probe signal at the optical receiver, the method comprising:
   varying one or both of an intensity value and the coupling frequency of the coupling signal so as to cause a variation in the change in power of the probe signal at the optical receiver due to the incident electromagnetic field at the transmission medium;
   monitoring the variation in the change in power of the probe signal due to the incident electromagnetic field at the transmission medium; and
   based on the monitoring of the variation in the change in power of the probe signal, setting at least one of the intensity value or the coupling frequency of the coupling signal so as to increase the change in power of the probe signal.

2. The method as claimed in claim 1, wherein a variation in the coupling frequency causes a greater variation in the change in power of the probe signal at the optical receiver than a variation in the intensity value, and the method further comprises:
   varying the coupling frequency of the coupling signal so as to cause the variation in the change in power of the probe signal at the optical receiver due to the incident electromagnetic field at the transmission medium;
   monitoring the variation in the change in power of the probe signal due to the incident electromagnetic field at the transmission medium in response to the variation of the coupling frequency;
   based on the monitoring of the variation in the change in power of the probe signal in response to the variation of the coupling frequency, setting the coupling frequency of the coupling signal so as to increase the change in power of the probe signal; and then,
   varying the intensity value of the coupling signal so as to cause the variation in the change in power of the probe signal at the optical receiver due to the incident electromagnetic field at the transmission medium;
   monitoring the variation in the change in power of the probe signal due to the incident electromagnetic field at the transmission medium in response to the variation of the intensity value; and
   based on the monitoring of the variation in the change in power of the probe signal in response to the variation of the intensity value, setting the intensity value of the coupling signal so as to increase the change in power of the probe signal.

3. The method as claimed in claim 1, wherein a variation in the intensity value causes a greater variation in the change in power of the probe signal at the optical receiver than a variation in the coupling frequency, and the method further comprises:
   varying the intensity value of the coupling signal so as to cause the variation in the change in power of the probe signal at the optical receiver due to the incident electromagnetic field at the transmission medium;
   monitoring the variation in the change in power of the probe signal due to the incident electromagnetic field at the transmission medium in response to the variation of the intensity value;
   based on the monitoring of the variation in the change in power of the probe signal in response to the variation of the intensity value, setting the intensity value of the coupling signal so as to increase the change in power of the probe signal; and then,
   varying the coupling frequency of the coupling signal so as to cause the variation in the change in power of the probe signal at the optical receiver due to the incident electromagnetic field at the transmission medium;
   monitoring the variation in the change in power of the probe signal due to the incident electromagnetic field at the transmission medium in response to the variation of the coupling frequency; and
   based on the monitoring of the variation in the change in power of the probe signal in response to the variation of the coupling frequency, setting the coupling frequency of the coupling signal so as to increase the change in power of the probe signal.

4. The method as claimed in claim 1, wherein varying the intensity value or the coupling frequency of the coupling signal, monitoring the variation in the change in power of the probe signal, and setting the coupling frequency based on the monitoring of the variation in the change in power of the probe signal are performed iteratively until a termination condition is met.

5. The method as claimed in claim 4, wherein the termination condition is that the power of the probe signal following the change in power of the probe signal is less than or equal to the power of the probe signal before the change in power of the probe signal.

6. The method as claimed in claim 1, wherein the transmission medium includes a metal vapor.

7. The method as claimed in claim 6, wherein the metal vapor is of an alkali metal.

8. The method as claimed in claim 7, wherein the alkali metal vapor is one of: Rubidium, Cesium or Strontium.

9. The method as claimed in claim 1, wherein the electromagnetic field is a Radio Frequency (RF) field and the electromagnetic field detector is an RF detector.

10. An electromagnetic field detector controller comprising a processor configured to implement the method of claim 1.

11. A system comprising an electromagnetic field detector and the electromagnetic field detector controller as claimed in claim 10.

12. A non-transitory computer-readable storage medium storing a computer program product comprising instructions that, when executed by a computer, cause the computer to carry out the method of claim 1.

13. A system comprising at least one processor and memory configured to carry out the method of claim 1.

* * * * *